(12) United States Patent
Lipson et al.

(10) Patent No.: US 6,791,746 B2
(45) Date of Patent: Sep. 14, 2004

(54) EXTENDED BANDWIDTH SEMICONDUCTOR OPTICAL AMPLIFIER

(75) Inventors: Jan Lipson, Cupertino, CA (US); Chris Dries, Skillman, NJ (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/348,641

(22) Filed: Jan. 21, 2003

(65) Prior Publication Data

US 2003/0151804 A1 Aug. 14, 2003

Related U.S. Application Data

(60) Provisional application No. 60/357,072, filed on Feb. 12, 2002.

(51) Int. Cl.⁷ ................................................. H01S 3/00
(52) U.S. Cl. ...................................................... 359/344
(58) Field of Search ................................ 359/344, 334; 372/6

(56) References Cited

U.S. PATENT DOCUMENTS

| | | | | |
|---|---|---|---|---|
| 4,794,346 A | * | 12/1988 | Miller | ........................ 359/344 |
| 5,579,155 A | | 11/1996 | Kitamura | |
| 6,040,938 A | * | 3/2000 | Ducellier | ..................... 359/344 |
| 6,186,631 B1 | | 2/2001 | Behringer et al. | |
| 6,274,398 B1 | | 8/2001 | Bendz et al. | |
| 6,512,629 B1 | * | 1/2003 | Dijaili et al. | ................ 359/344 |
| 6,545,801 B2 | * | 4/2003 | Morito | ........................ 359/344 |
| 6,671,086 B1 | * | 12/2003 | Wang et al. | ................. 359/344 |

* cited by examiner

*Primary Examiner*—Mark Hellner
(74) *Attorney, Agent, or Firm*—Workman Nydegger

(57) ABSTRACT

A Semiconductor Optical Amplifier (SOA) with extended bandwidth and the method of fabricating the same are disclosed. In one embodiment, the SOA includes a Multiple Quantum Well (MQW) stacks whose thickness varies along the length of the device. The SOA has a flatter and broader gain spectrum than SOAs with substantially flat MQW stacks.

19 Claims, 6 Drawing Sheets

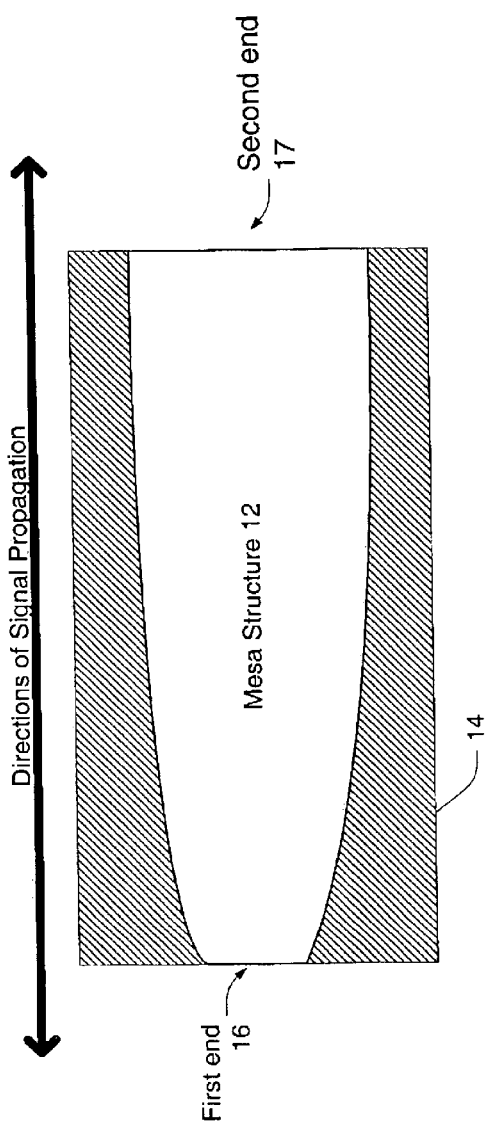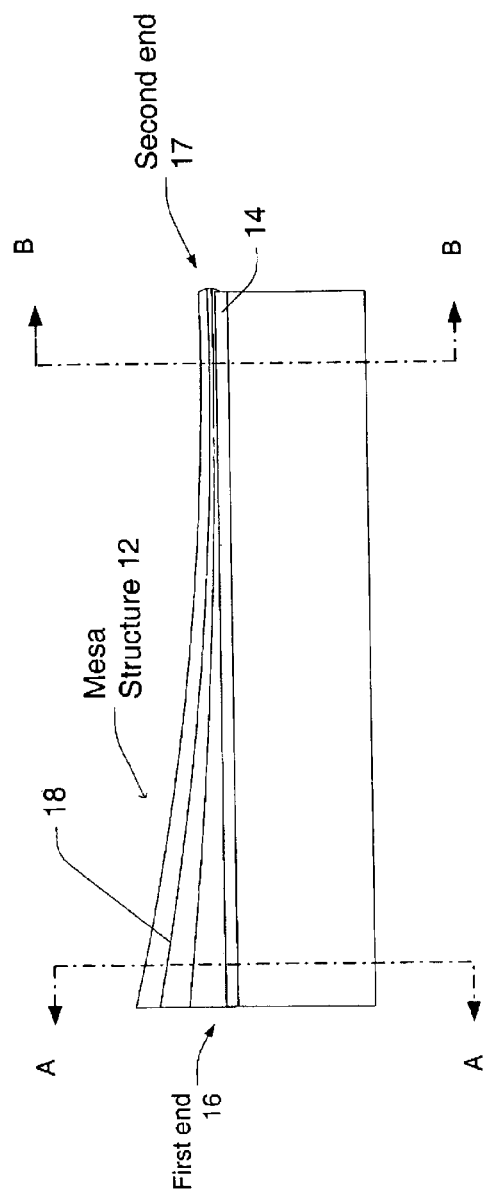

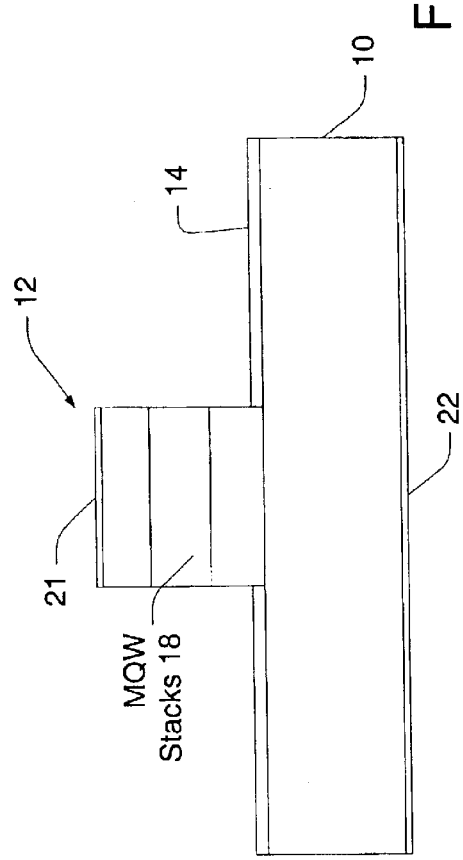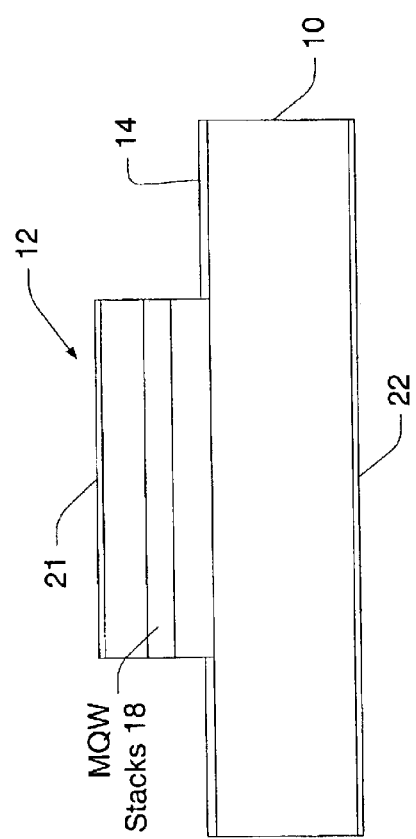

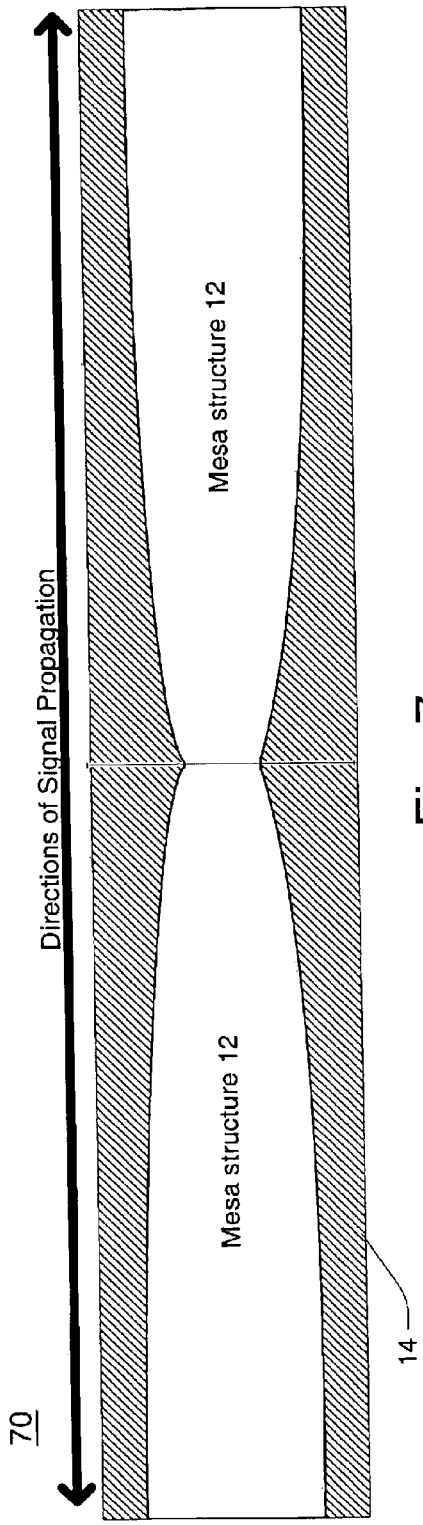
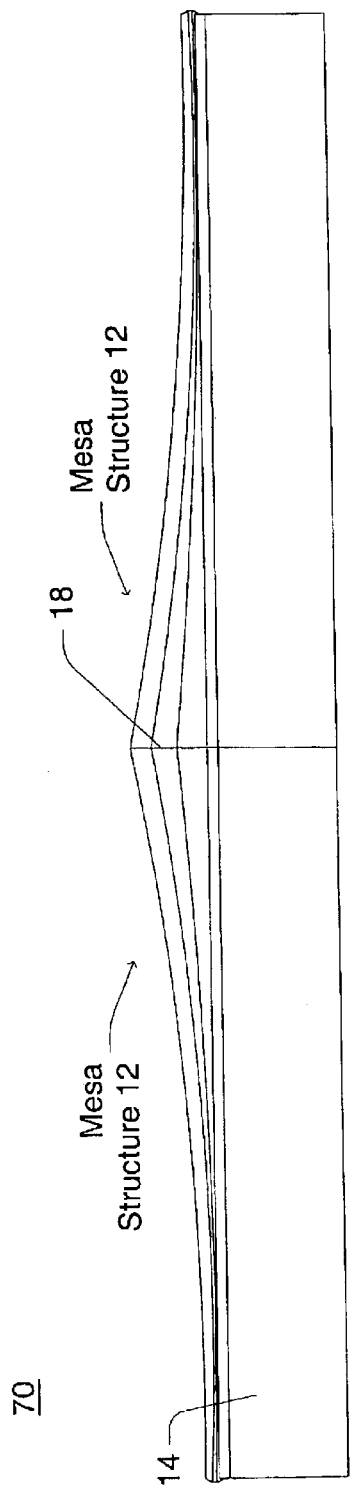

EXTENDED BANDWIDTH SEMICONDUCTOR OPTICAL AMPLIFIER

The present application claims priority under 35 U.S.C. 119(e) to U.S. Provisional Patent Application No. 60/357,072, filed Feb. 12, 2002, which is herein incorporated by reference in its entirety.

BRIEF DESCRIPTION OF THE INVENTION

The present invention relates generally to an extended bandwidth semiconductor optical amplifier.

BACKGROUND OF THE INVENTION

In optical communication systems, optical amplifiers play an important role in compensating for losses in multiplexing, splitting, switching, or wavelength converting. Semiconductor optical amplifiers (SOA's) are used widely to meet these needs. The use of SOA's is advantageous because they are less expensive and smaller than fiber amplifiers. One problem associated with conventional SOA's, however, is that their gain spectrum is narrow, typically around thirty to forty nanometers wide. Because of their narrow gain spectrum, the usefulness of conventional SOA's is somewhat limited in WDM (Wavelength Divisional Multiplexing) applications.

Accordingly, there exists a need for an optical amplifier whose gain spectrum is wider so as to cover as much of the useful fiber-optic communications spectrum as possible.

SUMMARY OF THE INVENTION

The present invention provides a semiconductor optical amplifier (SOA) with a wide gain spectrum. In one embodiment, the SOA has Multiple Quantum Well (MQW) stacks whose thickness varies along the length of the device. The gain spectrum of this embodiment is flatter and broader than conventional SOA's that are constructed using MQW stacks of uniform thickness.

Many semiconductor fabrication techniques can be used to fabricate the extended bandwidth SOA. Selective area growth is a technique that allows the growth rate to be varied as a function of position due to the proximity of a mask. When the gap between the masked areas is small the growth rate is highest. This results in thicker MQW stacks that have a gain peak at shorter wavelengths. In some embodiments where the MQW stacks are thicker at one end than at another, the cross-sectional area of the MQW stacks perpendicular to the propagation direction of optical signals remains largely constant.

BRIEF DESCRIPTION OF THE DRAWINGS

Aspects of the present invention will be more readily apparent from the following description and appended claims when taken in conjunction with the accompanying drawings, in which:

FIG. 2 is a top view of the SOA shown in FIG. 1;

FIG. 3 is a side view of the SOA shown in FIGS. 1 and 2;

FIG. 4 is a cross-sectional view of the SOA of FIGS. 1–3 near one of its ends;

FIG. 5 is a cross-sectional view of the SOA of FIGS. 1–3 near another one of its ends;

FIG. 7 illustrates a top view of a Semiconductor Optical Amplifier in accordance with an alternate embodiment of the present invention;

FIG. 8 illustrates a side view of a Semiconductor Optical Amplifier in accordance with an alternate embodiment of the present invention;

DESCRIPTION OF PREFERRED EMBODIMENTS

Preferred embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
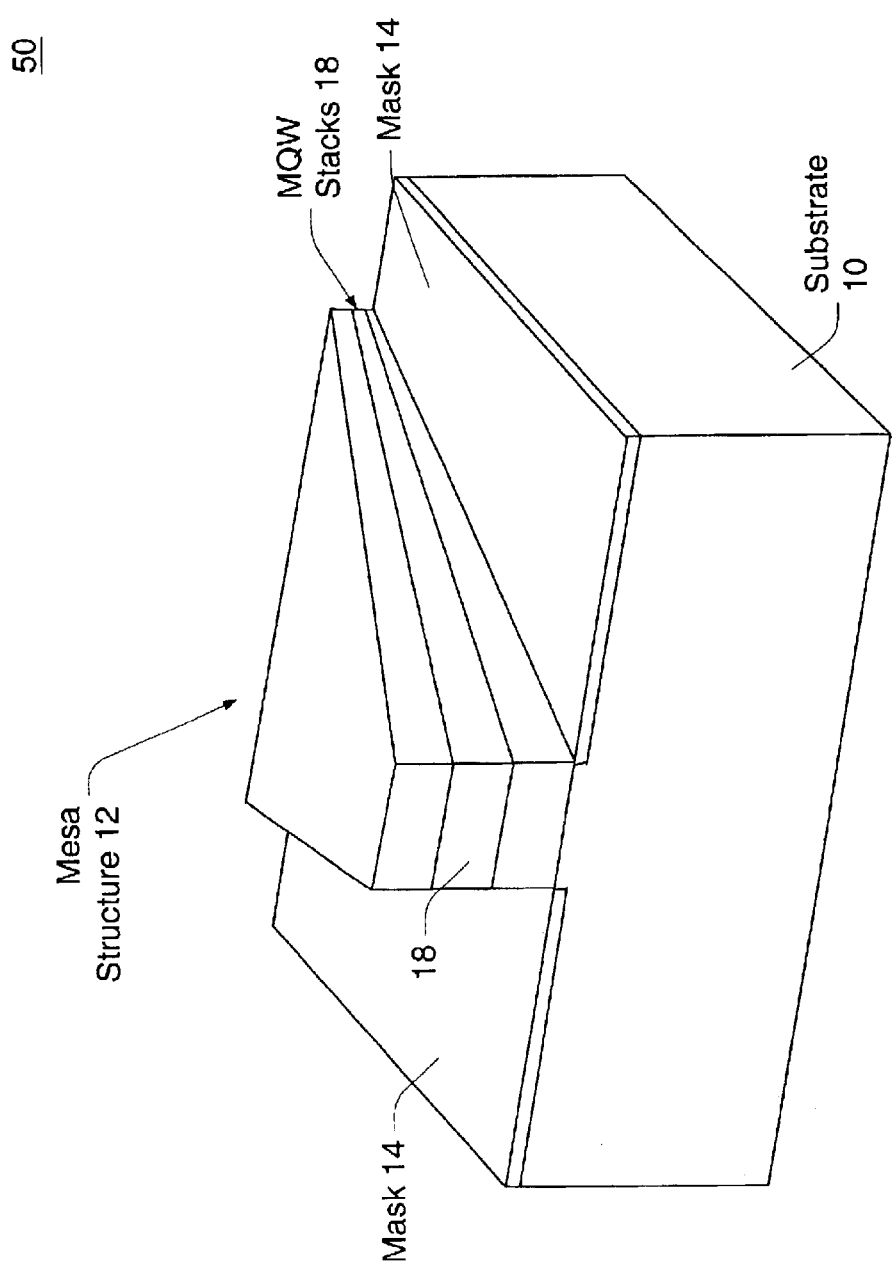
FIG. 1 is a perspective view of a semiconductor optical amplifier (SOA) according to an embodiment of the present invention.

FIGS. 1, 2 and 3 depict a perspective view, a top view and a side view of a semiconductor optical amplifier (SOA) 50 according to an embodiment of the present invention. In FIGS. 1–3, the SOA 50 has a substrate 10 and a mesa structure 12. Masks 14 are disposed on the substrate 10 along the sides of the mesa structure 12. In the present embodiment, the substrate 10 is made of III–V semiconductor materials such as InP, and the masks 14 are made of an amorphous semiconductor material, such as amorphous silicon dioxide.

In the embodiment illustrated in FIGS. 1, 2 and 3, the masks 14 are wider at a first end 16 of the mesa structure 12 than they are at a second end 17, and the mesa structure 12 is thicker at the first end 16 than it is at the second end 17. In this embodiment, light can propagate from the first end 16 to the second end 17, or vice versa, along the length of the mesa structure 12.

With reference again to FIGS. 1, 2 and 3, the mesa structure 12 has an active layer of Multiple Quantum Well (MQW) stacks 18 that include alternating layers of barriers and quantum wells. Both the barriers and quantum wells are formed using appropriately selected III–V semiconductor materials. When properly biased, the MQW stacks 18 amplify the optical signal received at one end 16 and emit amplified optical signal at the other end. In the present embodiment, electrodes (including an electrode 21 covering the top of the mesa structure 12 and another electrode 22 covering the bottom of the substrate 10) are used to provide the proper biasing of the SOA.

Figure 6:
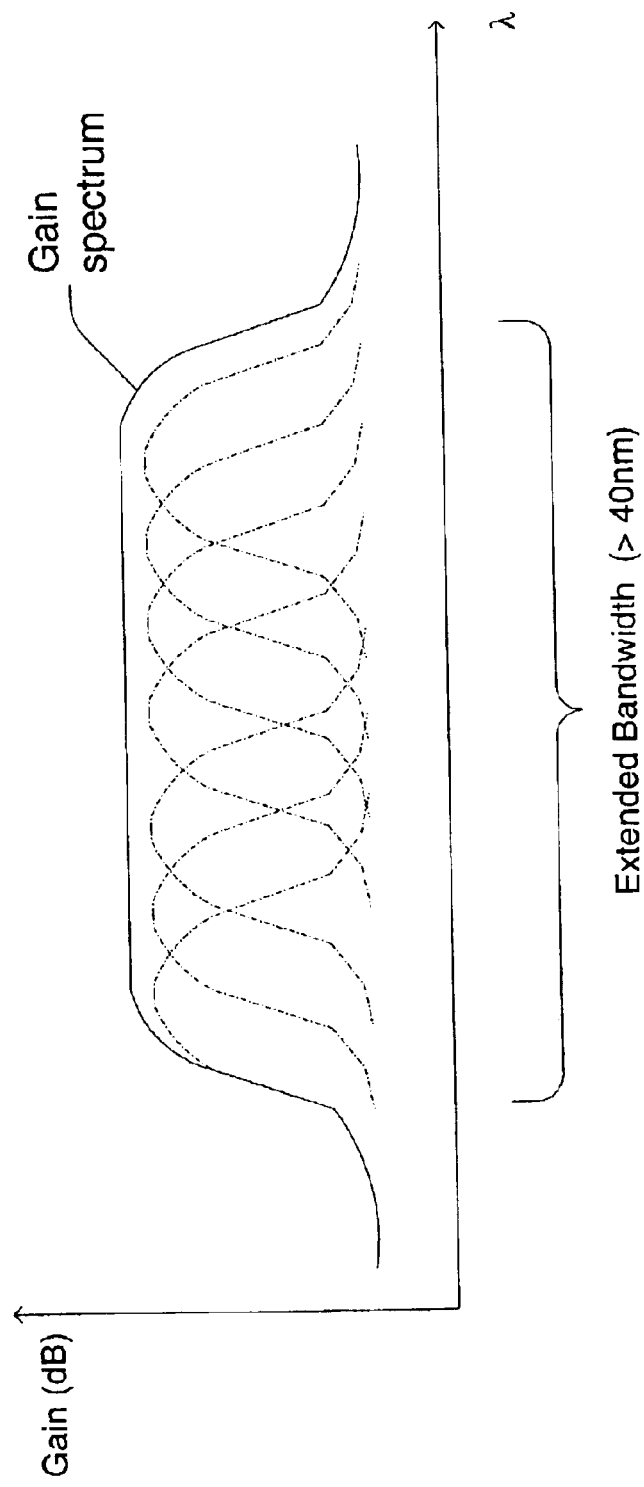
FIG. 6 is a graph illustrating the gain spectrum of an SOA according to an embodiment of the present invention.

The thickness of the MQW stacks 18 varies along the light propagation path of the SOA 50. The thickness of the MQW stacks 18, however, does not vary linearly from the first end 16 to the second end 17. Rather, the thickness varies in a non-linear fashion. In some portions of the SOA 50, the thickness of the MQW stacks 18 remains the same. The thicker MQW stacks preferably include thicker layers of quantum wells. According to the present invention, the gain spectrum is dependent on the thickness of the quantum wells. Therefore, at the thicker end 16, the gain is peaked at longer wavelengths due to the thicker MQW stacks. At the thinner end 17, the gain is peaked at shorter wavelengths. One may consider the MQW stacks 18 to be analogous to many SOA's of small gain connected in series, each SOA having a slightly different gain peak. Optical signals with a flat and broad gain spectrum, which is shown in FIG. 6 as an example, can thus be produced. The gain spectrum shown in FIG. 6 is wider than that of conventional semiconductor optical amplifiers.

Attention now turns to FIGS. 4–5 and a fabrication processes for fabricating the SOA 50. FIG. 4 illustrates the cross section of SOA 50 across line A—A, and FIG. 5 illustrates the cross section across line B—B of FIG. 3. This fabrication process utilizes a technique known as Selective Area Growth (SAG), which is a technique that allows the growth rate to be varied as a function of position due to the proximity of a mask. The SAG technique involves, in the present embodiment, forming masks 14 over the semiconductor substrate 10 so as to permit vapor phase growth of semiconductor crystals in unmasked area. The masks 14 are preferably formed by depositing an amorphous material not conducive to epitaxial growth of semiconductor materials on the substrate 10 and patterning the amorphous material to expose the unmasked area. The width of the gap between the masks 14 varies along the path in which light propagates. In this particular embodiment, the gap between the masks 14 is smaller at the first end 16 than the gap at the second end 17. As a result, the growth rate is higher at the first end 16. In other embodiments, the gap between the masks is larger at the light-receiving end than at the light-emitting end.

With reference still to FIGS. 4–5, a Metal-Organic Chemical Vapor Deposition (MOCVD) process is carried out to deposit semiconductor materials, including semiconductor materials for forming the MQW stacks 18, on the unmasked area. The thickness of the semiconductor materials grown on the exposed area varies according to the width of the exposed area. In particularly, where the gap between the masks 14 is small, the growth rate is higher, resulting in a thicker layer of semiconductor materials. Conversely, where the gap between the masks 14 is large, a thinner layer of semiconductor materials will be deposited. A product of the MOCVD process is the mesa structure 12 where the MQW stacks 18 are thicker near the first end 16 and near at the second end 17.

In some embodiments, although the MQW stacks 18 are thicker at one end than at another, the process can be controlled such that the cross-sectional area of the MQW stacks perpendicular to the propagation direction of optical signals remains substantially constant. Furthermore, in the embodiment shown in FIGS. 4–5, the mesa structure 12 has a rectangular cross-sectional area. In other embodiments, the mesa structure has a trapezoidal cross-sectional area. In yet other embodiments, the mesa structure has an inverted trapezoidal cross-sectional area.

Other processes, such as the formation of electrodes and application of anti-reflective coatings to the first end 16 and the second end 17, are carried out so as to complete the process of manufacturing the SOA 50.

FIGS. 7 and 8 illustrate a top view and a side view, respectively, of a Semiconductor Optical Amplifier 70 in accordance with an alternate embodiment of the present invention. The SOA 70 is formed by cascading two SOA's 50. In the embodiment shown in FIGS. 7 and 8, the thickness of the MQW stacks 18 varies along the direction of light propagation from one end to the other. As shown, a middle portion of the MQW stacks 18 is thicker than the end portions. The thicker MQW stacks 18 preferably include thicker layers of quantum wells. This embodiment of the present invention also has a flat and broad gain spectrum.

Figure 9:
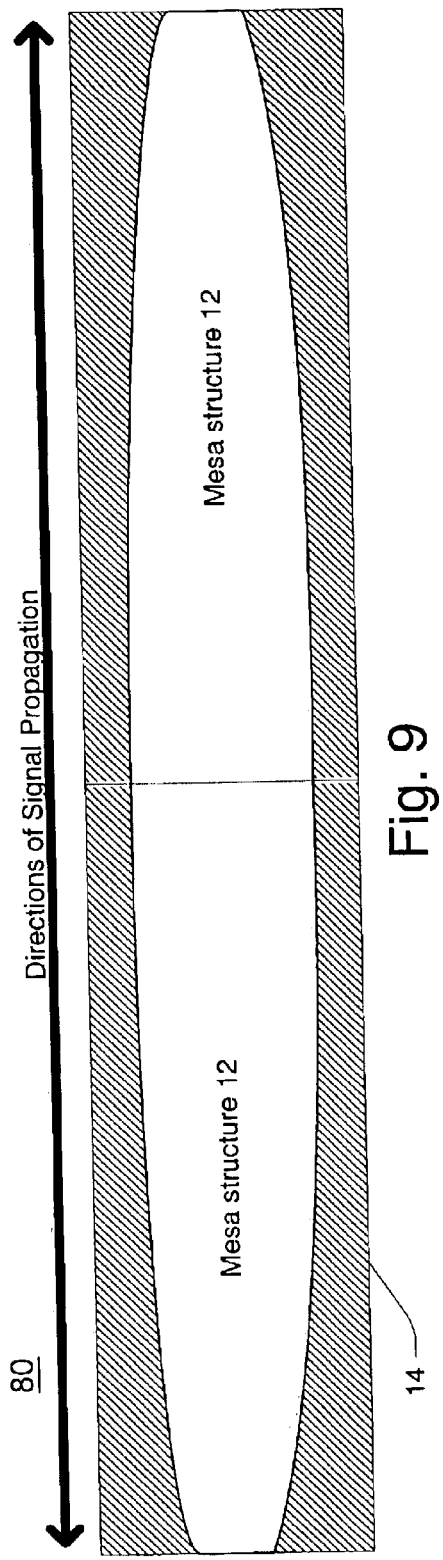
FIG. 9 illustrates a top view of a Semiconductor Optical Amplifier in accordance with an alternate embodiment of the present invention.
Figure 10:
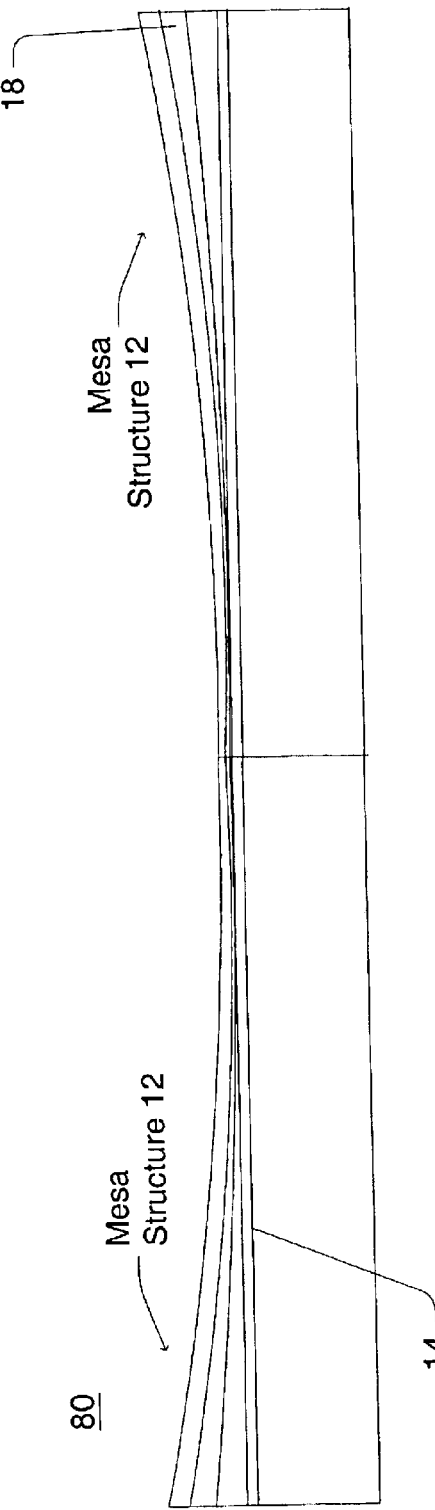
FIG. 10 illustrates a top view of a Semiconductor Optical Amplifier in accordance with an alternate embodiment of the present invention.

FIGS. 9 and 10 illustrate a top view and a side view, respectively, of a Semiconductor Optical Amplifier 80 in accordance with an alternate embodiment of the present invention. The SOA 80 is formed by cascading two SOA's 50. In the embodiment shown in FIGS. 9 and 10, the thickness of the MQW stacks 18 varies along the direction of light propagation from one end to the other. Particularly, the end portions of the MOW stacks 18 is thicker than the middle portion. The thicker MOW stacks 18 preferably include thicker layers of quantum wells. Similar to the embodiments described above, this embodiment of the present invention also has a flat and broad gain spectrum.

While the present invention has been described with reference to a few specific embodiments, the description is illustrative of the invention and is not to be construed as limiting the invention. Various modifications may occur to those skilled in the art having the benefit of this disclosure without departing from the inventive concepts described herein. For instance, multiple SOA's of the present invention can be cascaded with SOA's with substantially flat MQW stacks to form SOA's with a broad gain spectrum. The present invention can be used in many different types of apparatuses as well. For example, SOA's of the present invention can be integrated on a chip with other active components to either boost output in the case of lasers or electroabsorption lasers. SOA's of the present invention can also be used as optical amplifiers at the input stage of an optical receiver.

What is claimed is:

1. A semiconductor optical amplifier, comprising:
   a first end and a second end along a direction of light propagation; and
   an active layer including multiple quantum well stacks disposed between the first end and the second end and along the direction of light propagation, wherein a thickness of the multiple quantum well stacks varies along the direction of light propagation.

2. The semiconductor optical amplifier of claim 1, wherein the first end is receiving an optical signal.

3. The semiconductor optical amplifier of claim 2, wherein the second end is for emitting an amplified optical signal.

4. The semiconductor optical amplifier of claim 3, wherein a gain spectrum of the semiconductor optical amplifier has an extended bandwidth.

5. The semiconductor optical amplifier of claim 1, wherein the multiple quantum well stacks are thicker at the first end than at the second end.

6. The semiconductor optical amplifier of claim 1, wherein the multiple quantum well stacks are thicker at the second end than at the first end.

7. The semiconductor optical amplifier of claim 1, wherein a width of the multiple quantum well stacks are thicker at the second end than at the first end.

8. The semiconductor optical amplifier of claim 1, wherein a first portion of the active layer having a first thickness is operable to amplify light of a first wavelength.

9. The semiconductor optical amplifier of claim 8, wherein a second portion of the active layer having a second thickness is operable to amplify light of a second wavelength.

10. An extended bandwidth semiconductor optical amplifier, comprising:
   a substrate;
   a mesa structure disposed on the substrate, the mesa structure having a light-receiving end and a light-emitting end along a direction of light propagation, the mesa structure further having active layers therein for amplifying an optical signal received at the light-receiving end to produce an amplified optical signal for emission at the light-emitting end; and
   the active layers including at least a multiple quantum well stack disposed between the light-receiving end and the light-emitting end and along the direction of light propagation, wherein a thickness of the multiple quantum stack varies from the light-receiving end to the light-emitting end so as to achieve peak amplification of the optical signal across a range of wavelengths that is more than forty nanometers wide.

11. The extended bandwidth semiconductor optical amplifier of claim 10, wherein a width of the mesa structure varies from the light-receiving end to the light-emitting end.

12. The extended bandwidth semiconductor optical amplifier of claim 10, wherein the mesa structure is wider at the light emitting end than at the light-receiving end.

13. The extended bandwidth semiconductor optical amplifier of claim 10, wherein the mesa structure is wider at the light-receiving end than at the light-emitting end.

14. The extended bandwidth semiconductor optical amplifier of claim 10, wherein the multiple quantum well stack is thicker at the light-receiving end than at the light emitting end.

15. The extended bandwidth semiconductor optical amplifier of claim 10, wherein the multiple quantum well structure is thicker at the light-emitting end than at the light-receiving end.

16. A method of forming a semiconductor optical amplifier, comprising:
   forming a mask over a semiconductor substrate, the mask having two portions that define an unmasked area, wherein a width of a gap between the two portions of the mask varies; and
   depositing semiconductor materials on the unmasked area to form layers of semiconductor materials, the layers including at least one multiple quantum well stack whose thickness varies according to the width of the gap.

17. The method of claim 16, wherein the forming step comprises depositing an amorphous material not conducive to epitaxial growth of semiconductor materials on the semiconductor substrate.

18. The method of claim 17, wherein the forming step comprises patterning the amorphous material.

19. The method of claim 16, wherein the depositing step comprises depositing the semiconductor materials by a Metal-Organic Chemical Vapor Deposition process.

* * * * *

UNITED STATES PATENT AND TRADEMARK OFFICE
CERTIFICATE OF CORRECTION

PATENT NO.        : 6,791,746 B2           Page 1 of 1
APPLICATION NO. : 10/348641
DATED             : September 14, 2004
INVENTOR(S)       : Jan Lipson and Chris Dries It is certified that error appears in the above-identified patent and that said Letters Patent is hereby corrected as shown below:

Title page,
Item [56], References Cited, U.S. PATENT DOCUMENTS,
insert -- US2001/0043390      11/2001      Kim et al. --.
Item [57], ABSTRACT,
Line 3, before "Multiple" remove "a".

Column 3,
Line 40, change "particularly" to -- particular --.

Column 4,
Lines 14 and 15, change "MOW" to -- MQW --.

Signed and Sealed this

Eleventh Day of July, 2006

JON W. DUDAS
*Director of the United States Patent and Trademark Office*